(12) United States Patent
Solomko et al.

(10) Patent No.: US 12,586,744 B2
(45) Date of Patent: Mar. 24, 2026

(54) PHASE CHANGE MATERIAL SWITCH DEVICE AND RELATED METHODS

(71) Applicant: Infineon Technologies AG, Neubiberg (DE)

(72) Inventors: Valentyn Solomko, Munich (DE); Dominik Heiss, Munich (DE); Semen Syroiezhin, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 176 days.

(21) Appl. No.: 18/130,446

(22) Filed: Apr. 4, 2023

(65) Prior Publication Data

US 2023/0343531 A1     Oct. 26, 2023

(30) Foreign Application Priority Data

Apr. 21, 2022    (EP) .................................... 22169304

(51) Int. Cl.
| | |
|---|---|
| *H01H 37/14* | (2006.01) |
| *H01H 37/72* | (2006.01) |
| *H10N 70/00* | (2023.01) |
| *H10N 70/20* | (2023.01) |

(52) U.S. Cl.
CPC ............ *H01H 37/14* (2013.01); *H01H 37/72* (2013.01); *H10N 70/231* (2023.02); *H10N 70/823* (2023.02); *H10N 70/8613* (2023.02)

(58) Field of Classification Search
CPC ...... H01H 37/14; H01H 37/72; H10N 70/231; H10N 70/8613; H10N 70/823

USPC .......................................................... 337/298
See application file for complete search history.

(56) References Cited

U.S. PATENT DOCUMENTS

| | | | | |
|---|---|---|---|---|
| 5,218,508 | A * | 6/1993 | Doone ..................... | H01C 7/12 |
| | | | | 361/127 |
| 12,068,123 | B2 * | 8/2024 | Taddiken ............... | H03K 17/18 |
| 2007/0096248 | A1 | 5/2007 | Philipp et al. | |
| 2014/0191181 | A1 * | 7/2014 | Moon ................... | H10N 70/011 |
| | | | | 257/4 |
| 2016/0079019 | A1 * | 3/2016 | Borodulin ............ | H10N 70/231 |
| | | | | 337/396 |
| 2022/0199343 | A1 * | 6/2022 | Taddiken ............... | H03K 17/24 |
| 2023/0337554 | A1 * | 10/2023 | Wohlmuth ......... | H10N 70/8613 |
| 2024/0276897 | A1 * | 8/2024 | Chen .................. | H10N 70/8613 |

OTHER PUBLICATIONS

Bettoumi, Ines, et al., "Phase Change Material (PCM) RF Switches With Integrated Decoupling Bias Circuit", IEEE Microwave and Wireless Components Letters, vol. 32, No. 1, Jan. 2022, pp. 52-55.

(Continued)

*Primary Examiner* — Anatoly Vortman
(74) *Attorney, Agent, or Firm* — Murphy, Bilak & Homiller, PLLC

(57) ABSTRACT

A phase change material switch device is provided. The phase change material switch device includes a phase change material, a first electrode electrically coupled to the phase change material, and at least one heater thermally coupled to the phase change material. An equalization device is configured to provide an impedance coupling between the first electrode and the phase change material. The impedance coupling varies over the phase change material.

13 Claims, 9 Drawing Sheets

(56)          References Cited

OTHER PUBLICATIONS

Singh, Tejinder, et al., "Characterization, Optimization, and Fabrication of Phase Change Material Germanium Telluride Based Miniaturized DC-67 GHz RF Switches", IEEE Transactions on Microwave Theory and Techniques, vol. 67, No. 8, Aug. 2019, pp. 3237-3250.

* cited by examiner

Fig. 2A                                    PRIOR ART

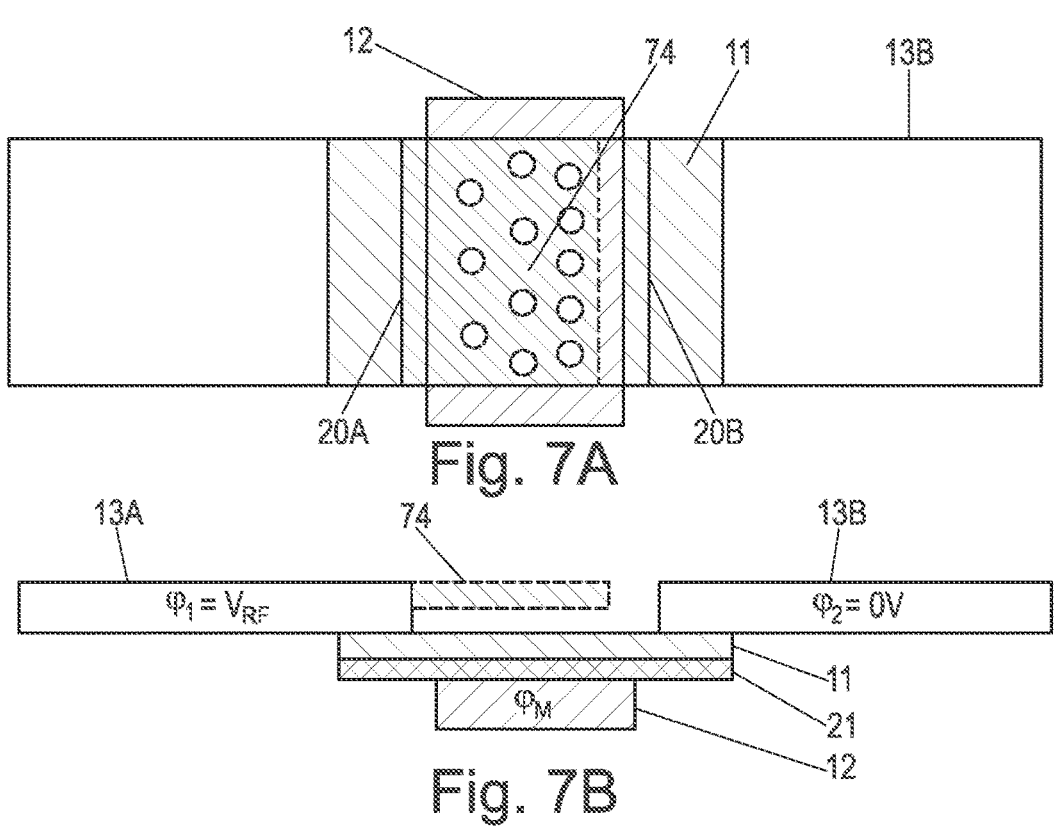
Fig. 7A
Fig. 7B
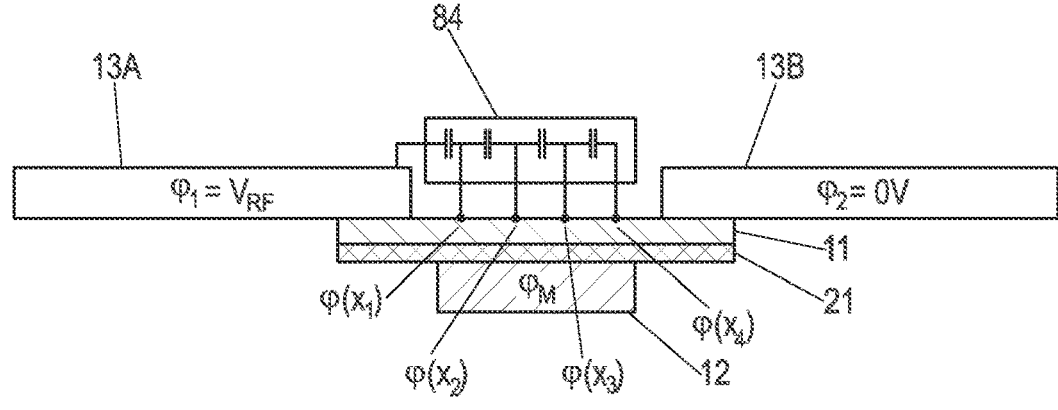
Fig. 8
Fig. 9

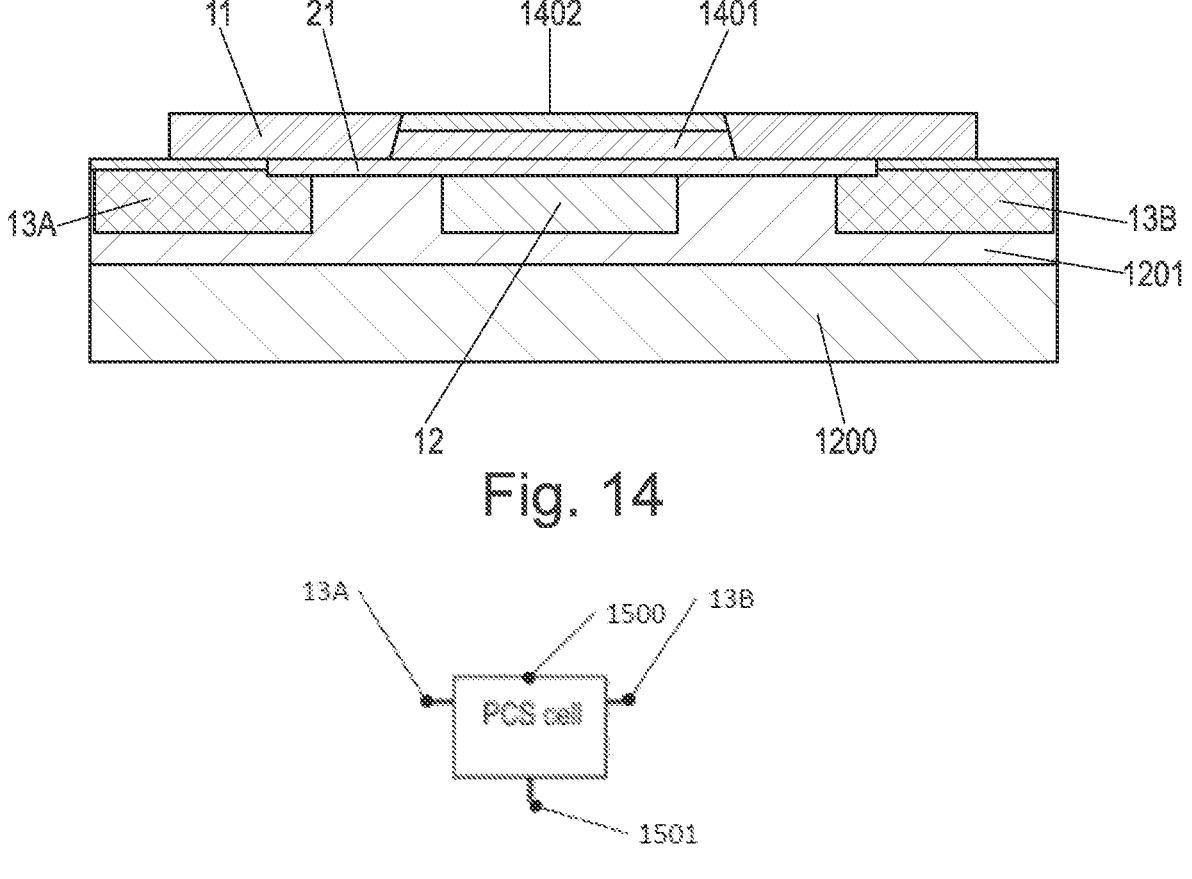
Fig. 14
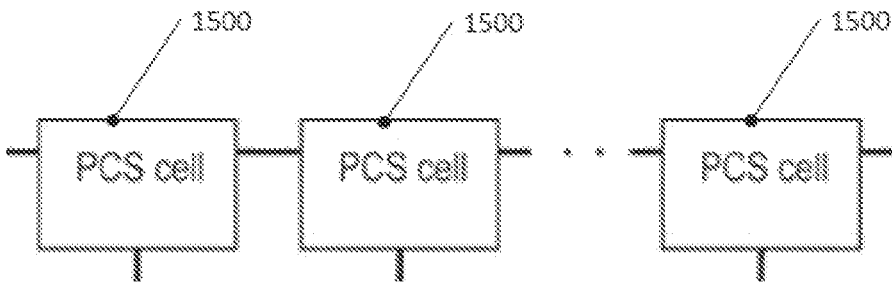
Fig. 15A
Fig. 15B

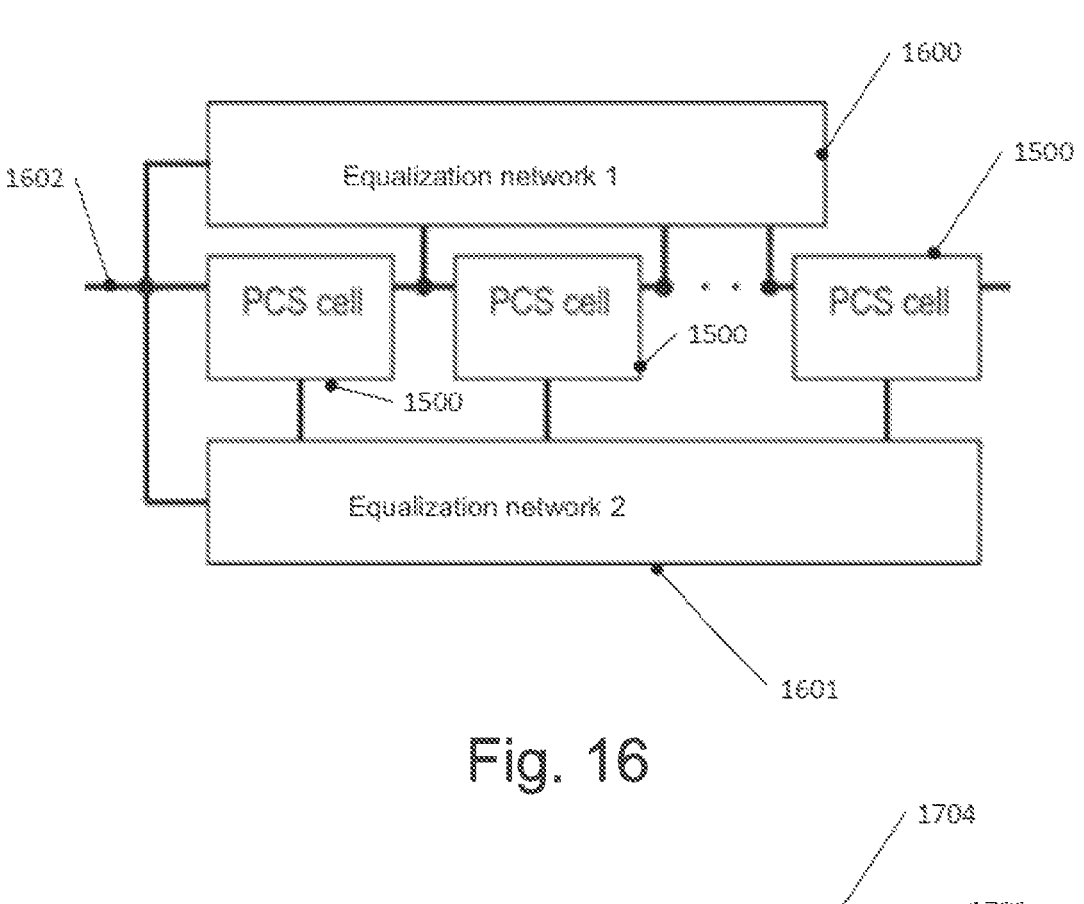
Fig. 16
Fig. 17
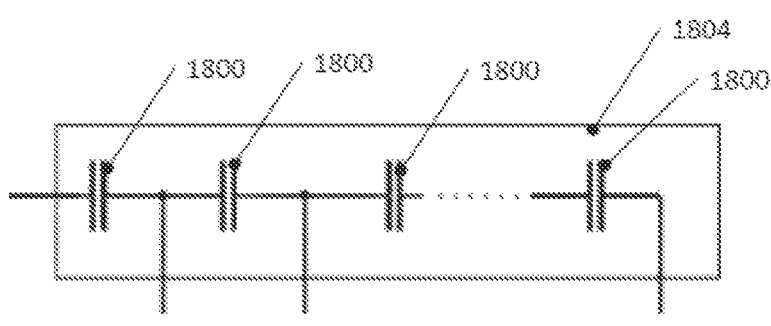
Fig. 18

PHASE CHANGE MATERIAL SWITCH DEVICE AND RELATED METHODS

TECHNICAL FIELD

The present application relates to phase change material (PCM) switch devices, methods for manufacturing such devices and methods for operating such devices.

BACKGROUND

The technical requirements for radio frequency (RF) applications using high frequencies, such as radar sensing and mobile communication according to the 5G standard, are increasing. In particular, switches having improved characteristics compared to state-of-the-art CMOS switches will be required to meet future demands. Phase change switches are considered as promising candidates for switching RF signals. Such phase change switches use a phase change material (PCM) which typically exhibits a higher electric conductivity in a crystalline phase state than in an amorphous phase state. By changing the phase state of the phase change material, a switch device including such a material may be switched on and off.

For example, to change the phase state from amorphous to crystalline, typically a heater is employed heating the phase change material causing crystallization. This switching on by causing crystallization is also referred to as a set operation. In the set operation, the heater is actuated in such a way that the temperature of the phase change material is above its crystallization temperature, typically about 250° C., but below the melt temperature typically in a range of 600° C. to 900° C., for example. The length of the heating pulse caused by the heater is chosen such that any amorphous region present in the PCM can regrow into the crystalline phase state.

When switching off the switching device, also referred to as reset operation, the heater is actuated in such a way that the temperature of the PCM is raised above the melt temperature (for example above about 600° C. to 900° C.) followed by a comparatively rapid cooldown which freezes the phase change material or at least a portion thereof into an amorphous state.

Suitable phase change materials used for such phase change switches include germanium telluride (GeTe) or germanium-antimony-tellurium (GeSbTe, usually referred to as GST), and heaters may be made of a material like polycrystalline silicon or tungsten.

PCM switch devices promise excellent radio frequency performance in comparison to state of the art CMOS RF switches. In particular, the main figure of merit, the product of on-resistance and off-capacitance, is reduced significantly from around 80 fsec for CMOS RF switches to values below 20 fsec for PCM switch devices.

Another important aspect of radio-frequency switch devices is the RF power handling, in particular which power or voltage the switches can handle in an off state. Typical applications in mobile front end antenna tuners require a maximum RF voltage exceeding 80 V or 48 dBm power on 50 Ohm.

The off state power/voltage-handling is limited by the voltage dropping over the amorphous zone of the phase change material in the switched off state of the switch device. If the electrical field in the amorphous zone exceeds a critical value, tunneling currents can flow, which may heat up the amorphous zone and may cause recrystallization. For germanium telluride, the critical value is typically in the range of 10-16 V/μ m. With this process, the amorphous zone may even disappear, effectively switching the switch device on.

One approach to increase the capabilities of handling high voltages in an off state is increasing the length of the amorphous zone, i.e. increasing the corresponding size of the PCM switch, such that the voltage drops over a longer distance and therefore, the electrical field is reduced. This is feasible up to the point where the direct capacitance over the amorphous zone is comparable to a parasitic capacitance from the radio frequency path to ground via the heater of the PCM switch. As soon as the capacitance to ground dominates, the distribution of the electric field over the phase change switch becomes inhomogeneous, and an increased length of the amorphous zone will no longer proportionally increase the capability to handle high voltages in an off stage.

SUMMARY

According to an embodiment, a phase change material switch device is provided, comprising: a phase change material, a first electrode electrically coupled to the phase change material, at least one heater thermally coupled to the phase change material, and an equalization device configured to provide an impedance coupling between the first electrode and the phase change material that varies over the phase change material.

According to another embodiment, a phase change material switch device is provided, comprising: a phase change material, a first electrode electrically coupled to the phase change material, a plurality of spaced apart heaters thermally coupled to the phase change material, and an equalization device configured to provide a varying impedance coupling between the first electrode and the plurality of spaced-apart heaters.

In yet another embodiment, a method for manufacturing a phase change material switch device is provided, comprising: providing a phase-change switch including a phase change material, a first electrode electrically coupled to the phase change material, and at least one heater thermally coupled to the phase change material, and providing an equalization device configured to provide an impedance coupling between the first electrode and at least one of the phase change material that varies over the phase change material or between the first electrode and the at least one heater varying over the at least one heater.

In yet another embodiment, a method for a phase change switch device is provided, comprising: operating the phase-change switch device, and compensating a varying electric field in an off-state of the phase-change switch device by a varying impedance coupling.

The above summary is merely intended as a brief overview over some embodiments and is not to be construed as limiting in any way, as other embodiments may include different features from the ones listed above.

BRIEF DESCRIPTION OF THE DRAWINGS

FIGS. 2A and 2B are illustrations for explaining embodiments, where FIG. 2A shows a top view of a PCM switch device without equalization device for comparison purposes, and FIG. 2B shows a cross-sectional view of the PCM switch device of FIG. 2A together with graphs showing the potential (voltage) and electric field in relation to the cross-sectional view.

FIGS. 3-14 illustrate various embodiments of phase change material switch devices, where FIG. 3 illustrates a PCM switch device using a capacitive coupling as imped-ance coupling, FIGS. 4A and 4B illustrate a PCM switch device according to another embodiment, FIG. 8 is a cross-sectional view illustrating an embodiment, FIG. 9 illustrates a cross-sectional view of an embodiment showing a possible imple-mentation of a series chain of capacitors, FIG. 10 illustrates another implementation of a series capacitors, FIGS. 11A and 11B show a further example for an equalization device using a varying capacitance, FIGS. 12A-12C show various embodiments using such a resistive coupling established by an additional layer having an appropriate ohmic resistance, FIG. 13 illustrates a cross-sectional view of a PCM switch device according to a further embodiment, and FIG. 14 illustrates a modification to the embodiment of FIG. 13.

FIGS. 15A and 15B are diagrams for explaining stacked phase-change switch cells, where FIG. 15A illustrates a phase change switch (PCS) cell and FIG. 15B shows a switch device having a plurality of PCS cells coupled in series.

FIG. 16 is a block diagram illustrating a phase change material switch device according to an embodiment.

FIGS. 17 and 18 are diagrams illustrating implementa-tions of equalization networks in the embodiment of FIG. 16, where FIG. 17 illustrates an equalization device as a network of parallel capacitors and FIG. 18 illustrates an equalization device with a plurality of series capacitors.

DETAILED DESCRIPTION

Figure 1:
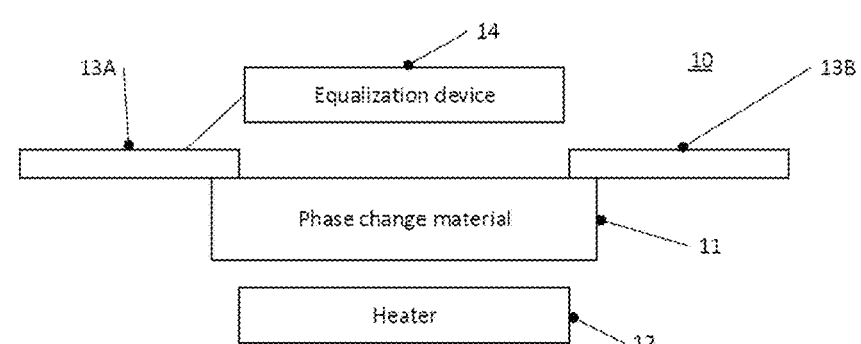
FIG. 1 is a block diagram of a phase change material switch device according to an embodiment.

In the following, various embodiments will be described in detail referring to the attached drawings. The embodi-ments described hereinafter are to be taken as examples only and are not to be construed as limiting. For example, while in embodiments specific arrangements or components are provided, in other embodiments other configurations may be used.

Implementation details described with respect to one of the embodiments are also applicable to other embodiments.

Features from different embodiments may be combined to form further embodiments.

Variations and modifications described for one of the embodiments may also be a applied to other embodiments and will therefore not be described repeatedly.

In the Figures, like elements are designated with the same reference numerals. Such elements will not be described repeatedly in each figure to avoid repetitions.

Besides features (for example components, elements, acts, events or the like) explicitly shown and described, in other embodiments additional features may be provided, for example features used in conventional switch devices using phase change materials. For example, embodiments described herein relate to equalization devices in phase change material (PCM) switch devices, and other compo-nents and features, like spatial arrangement of heaters and phase change material, radio frequency (RF) circuitry using the switch device and the like may be implemented in a conventional manner Such RF circuitry may be integrated with the described switch devices on the same substrate, but may also be provided separately for example, on one or more separate chip dies, which in some implementations then may be combined with a switch device in a common package. Also, manufacturing implementations like provid-ing phase change material on a substrate like a silicon substrate to implement a PCM switch device or in a part thereof like a trench for manufacturing the switch device and the like may be performed in any conventional manner.

A switch based on a phase change material (PCM) will be referred to as a phase change switch (PCS) or PCM switch herein. As explained in the introductory portion, such phase change switches may be set to a crystalline phase state or an amorphous phase change, thus changing the resistance of the phase change material and therefore of the switch by several orders of magnitude. In this way, for example an on-resistance of a switch in a range of 1 to $100\Omega$ may be achieved, whereas an off-resistance may be several orders of magnitude higher, for example at least in the Kiloohm range.

PCM switch devices discussed herein may be manufac-tured for example in layer deposition and pattering processes similar to those used in semiconductor device manufactur-ing, by depositing or modifying layers on a substrate. In some embodiments discussed herein, cross-sectional views and top views are illustrated. A cross-sectional view essen-tially corresponds to a cross section through the substrate, whereas a top view is a view in a direction towards a surface of the substrate. Any directional terminology used when referring to the drawings (e.g. up, down, left, right) is merely for indicating elements and directions in the drawings and is not intended to imply a directional orientation of the actually implemented devices.

While phase change switch devices in the embodiment below are shown with a configuration where a heater is provided below a phase change material, in other embodi-ments the heater may be provided above the phase change material. Furthermore, currents through the phase change material and through the heater may run in the same direc-tion or in perpendicular directions. Therefore, the specific configurations shown are not to be construed as limiting in any way.

Turning now to the Figures, FIG. 1 is a schematic block diagram illustrating a phase change material switch device (PCM switch device) 10 according to an embodiment.

Phase-change switch device 10 of FIG. 1 includes a phase change material 11 and a heater 12 in thermal contact with phase change material 11. For example, in a manufacturing process heater 12 and phase change material 11 may be deposited as layers on a substrate, with an electrically insulating but thermally conducting layer inbetween.

Electrodes 13A, 13B are coupled to phase change mate-rial 11. In operation, a signal to be switched, for example a radio frequency signal, is applied for example to electrode 13A, whereas electrode 13B is coupled to a further device (for example tuning capacitors in case of antenna tuning) that is to receive or not to receive the signal applied to electrode 13A, depending on the switching state of PCM switch device 10. By changing the state of phase change material 11 through heating with heater 12 as described already in the introductory portion, PCM switch device 10 may be switched on or off.

The configuration of PCM switch device 10 described so far corresponds to conventional PCM switch devices, and implementation details may be as for conventional devices.

Unlike conventional PCM switch devices, PCM switch device 10 further includes an equalization device 14 which is configured to provide an impedance coupling between the electrode 13A (and optionally also electrode 13B) and phase change material 11 that varies over the phase change material. In FIG. 1, a direct electrical coupling between equalization device 14 and electrode 13A is indicated. However, the coupling may also be via a portion of phase change material 11 that stays electrically conducting to some extent, for example crystalline or partially crystalline, when the PCM switch device 10 is switched off. In this respect, in usual implementations some portions of phase change material 11 close to electrodes 13A, 13B remain crystalline and therefore electrically conducting throughout the operation of PCM switch 10, and only a portion therebetween is switched between a crystalline state and an amorphous state.

The impedance coupling provided by equalization device 14, as will be explained further below for respective embodiments, may for example comprise a capacitive coupling, a resistive coupling or a combination of the two. The varying impedance coupling is provided such that a variation of an electrical field over the length of the phase change material 11 when the PCM switch device 10 is in a switched off state and a voltage is applied to electrode 13A is at least partially compensated, i.e. the variation of the electrical field is reduced by providing the equalization device 14 compared to a case where no equalization device is provided.

Figure 2B:
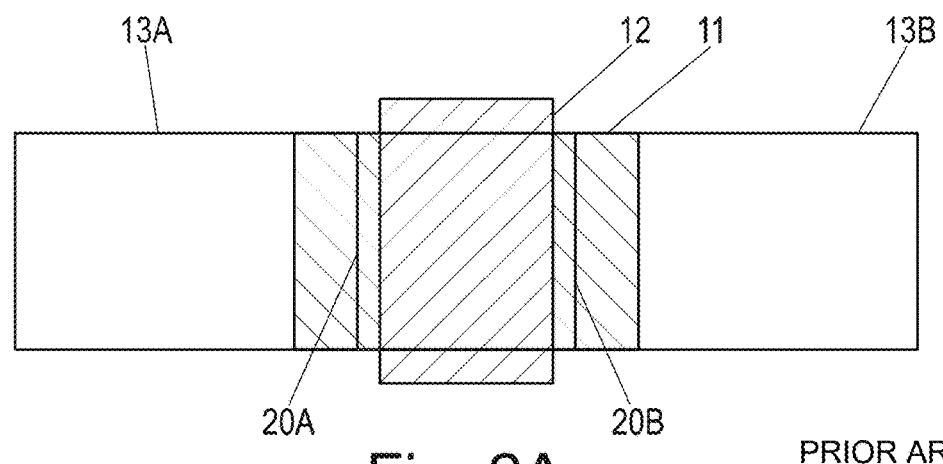
Figure 2B:
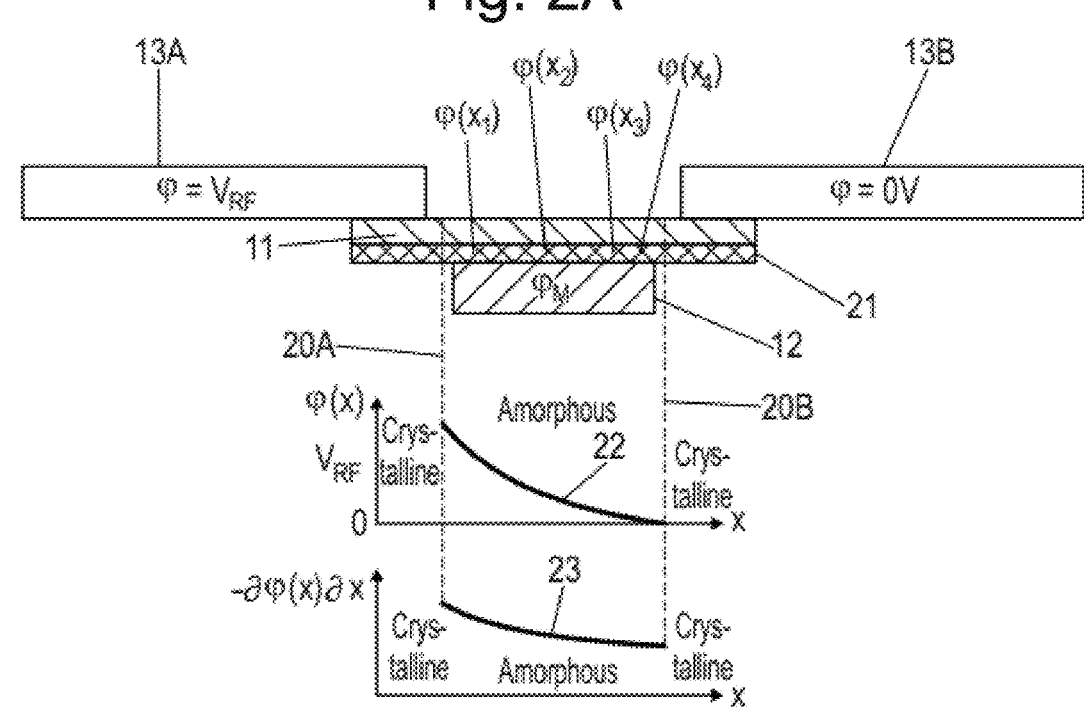

The problem of varying electric field will be further explained referring to FIGS. 2A and 2B, where FIG. 2A shows a top view of a PCM switch device without equalization device for comparison purposes, and FIG. 2B shows a cross-sectional view of the PCM switch device of FIG. 2A together with graphs showing the potential (voltage) and electric field in relation to the cross-sectional view.

The PCM switch device of FIGS. 2A and 2B, similar to the device of FIG. 1, comprises the electrodes 13A, 13B, phase change material 11 and heater 12. As can be seen in the cross-sectional view, heater 12 is separated from phase change material 11 via an electrically insulating, but thermally conducting layer 21. For the following explanation, we assume that the PCM switch device is in an off state. In this case, the phase change material 11, by appropriate heating, is amorphous at least between lines 20A and 20B shown in FIGS. 2A and 2B. The remaining phase change material may remain in a crystalline state or may be in a mixture between amorphous and crystalline states.

Furthermore, for explanatory purposes to electrode 13A a potential (voltage)$\varphi_{r1}=V_{RF}$ is applied, whereas electrode 13B is at $\varphi_{r2}=0$ V. Voltage $V_{RF}$ in practical uses of such switch device often is a varying voltage, like a radio frequency signal (RF signal) or an AC (alternating current) voltage.

In practical implementations of RF switches, in such an off state heater 12 may be grounded, i.e. be set to zero volt. Furthermore, in practical implementations of RF switches heater 12 is comparatively close to phase change material 11, i.e. layer 21 is thin to provide effective heating.

While without heater 12 the voltage drop across the amorphous region of phase change material 11 would be almost linear, due to capacitive coupling the gradient of the potential, the potential being shown by a curve 22 in FIG. 2B between lines 20A and 20B, i.e. for the amorphous zone, becomes nonlinear with a steeper slope closer to electrode 13A compared to a slope closer to electrode 13B. The electrical field $E_x(x)$ is the derivative of the potential with respect to x, i.e.

$$E_x(x) = -\frac{\partial \varphi(x)}{\partial x}$$

Therefore, a nonlinear dropping potential also results in a varying electrical field in the amorphous region, as shown by a curve 23 in FIG. 2B. In particular, the electrical field is stronger closer to electrode 13A. In other words, $E_x(x_1) > E_x(x_2)$ where $x_1$ is the position at line 20A and $x_2$ is the position at line 20B.

Such a varying strength of the electric field reduces the voltage handling capabilities of the switch device, as the highest electrical field is where the above-mentioned inadvertent recrystallization due to a high E-field may be initiated. In case the heater is not grounded, but for example exited by the radio frequency signal applied to electrode 13A, the electric field may have a more complex dependence on the position, still reducing the voltage handling capabilities.

Equalization device 14 at least partially compensate this effect, leading to a more uniform distribution of the electric field over the amorphous portion of the phase change material in an off state. As already explained with respect to FIG. 1, this may be achieved by a varying impedance coupling. More specific examples for such couplings and implementations thereof will be explained next using various embodiments as examples.

Figures 3, 4A, 4B:
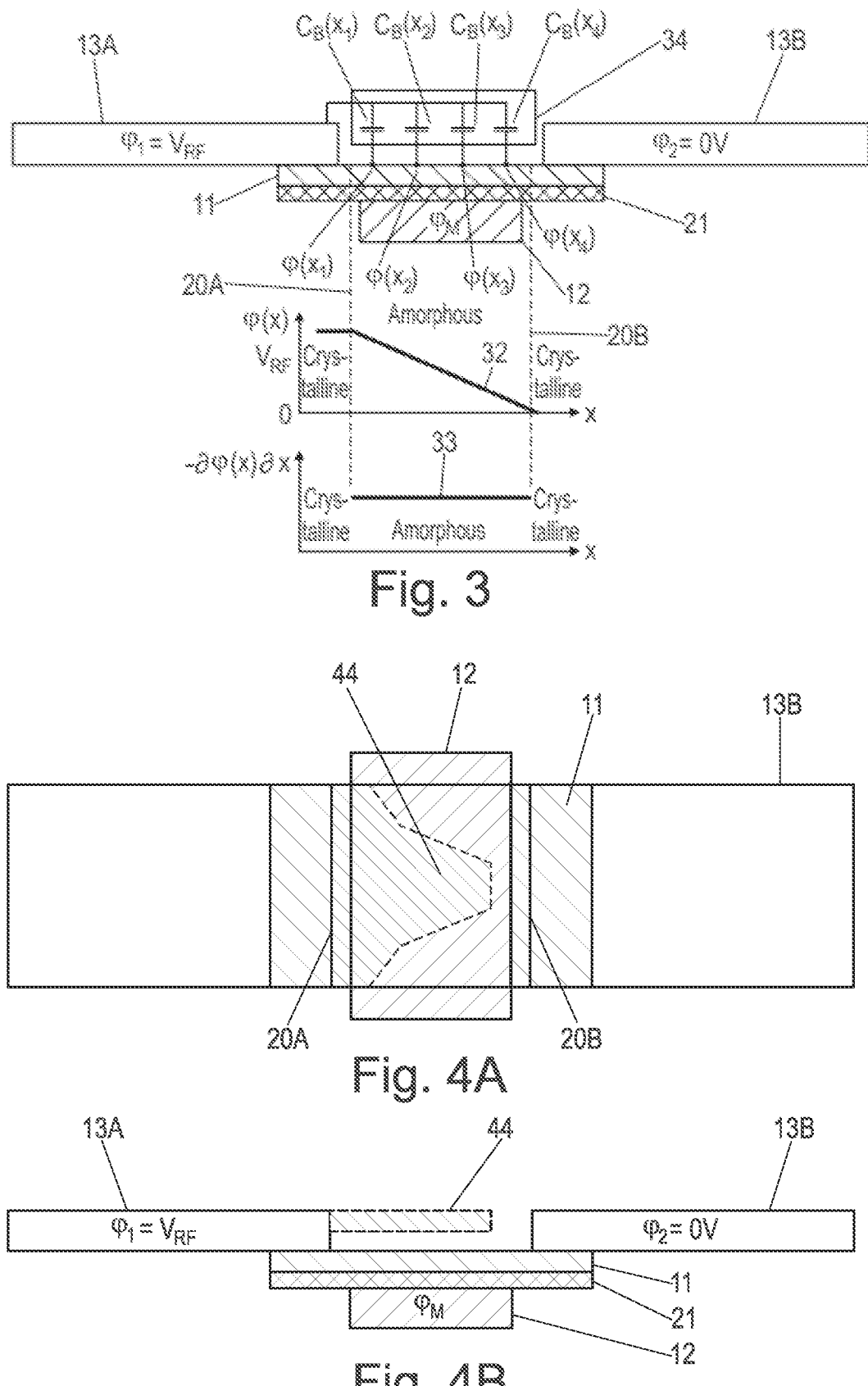

FIG. 3 illustrates a PCM switch device using a capacitive coupling as impedance coupling. FIG. 3 illustrates a cross-sectional view similar to the cross-sectional view of FIG. 2B, with the addition of an equalization device 34 realized as a capacitive network capacitively coupling electrode 13A to phase change material 11. The capacitance values of capacitors of equalization device 34 are tuned such that an essentially constant electrical field is achieved. Corresponding capacitance values may be determined by calibration measurements, simulations or the like. Capacitors of equalization device 35 may be provided as discrete capacitors or as a continuously varying capacitance, as will be explained further below using various examples.

In the example of FIG. 3, for illustration purposes four capacitors $C_B(x_1)$ to $C_H(x_4)$ are shown, modifying potentials $\varphi(x_1)$ to $\varphi(x_4)$ at corresponding positions $x_1$ to $x_4$ in phase change material 11. As shown in a curve 32, this may lead to a lineally decreasing potential $\varphi(x)$ across the amorphous region of phase change material 11 and, as shown by curve 33, to an essentially constant electrical field.

To give a specific example comparable to the situation discussed with reference to FIGS. 2A and 2B, $\varphi_H = \varphi_{r2} = 0$ V meaning that electrode 13B and heater 12 are grounded, $\varphi_{r1} = V_{RF}$, $C_B(x_1) > C_B(x_2) > C_B(x_3) > C_B(x_4)$, and $\varphi(x_2) - \varphi(x_1) = \varphi(x_3) - \varphi(x_2) = \varphi(x_4) - \varphi(x_3)$ given that $x_2 - x_1 = x_3 - x_2 = x_4 - x_3$, resulting in $E_x(x_1) = E_x(x_2) = E_x(x_3) = E_x(x_4)$.

Various ways for obtaining such variable capacitances will be described next. FIGS. 4A and 4B illustrate a PCM switch device according to another embodiment. FIG. 4A illustrates a top view similar to the top view of FIG. 2A, and FIG. 4B illustrates a cross-sectional view similar to the cross-sectional view of FIG. 2B.

In the PCM switch device of FIGS. 4A and 4B, the equalization device is formed by a tapered electrically conducting element 44, for example a metal portion or highly doped semiconductor portion, electrically coupled to electrode 13A and provided in a distance to phase change material 11. Between phase change material 11 and electrically conducting element 44, for example an electrically isolating layer may be provided, like a silicon dioxide layer or a silicon nitride layer. As can be seen in FIG. 4A, the width of the electrically conducting element 44 as seen in the top view decreases from first electrode 13A to second electrode 13B. This corresponds to a gradually decreasing capacitance between electrically conducting element 44 and phase change material 11, therefore fulfilling the relationship above for decreasing capacitance value with further distance from electrode 13A explained above. Conducting element 44 in the example of FIGS. 4A and 4B covers the complete width of the phase change material close to electrode 13A, and decreases its width towards electrode 13B. In other embodiments, also at or near electrode 13A only part of the phase change material may be covered in the top view of FIG. 4A, depending on the required capacitive coupling strength.

The embodiment of FIGS. 4A and 4B is an example without discrete capacitances, where the capacitance continuously decreases.

Figures 5A, 5B, 6A, 6B:
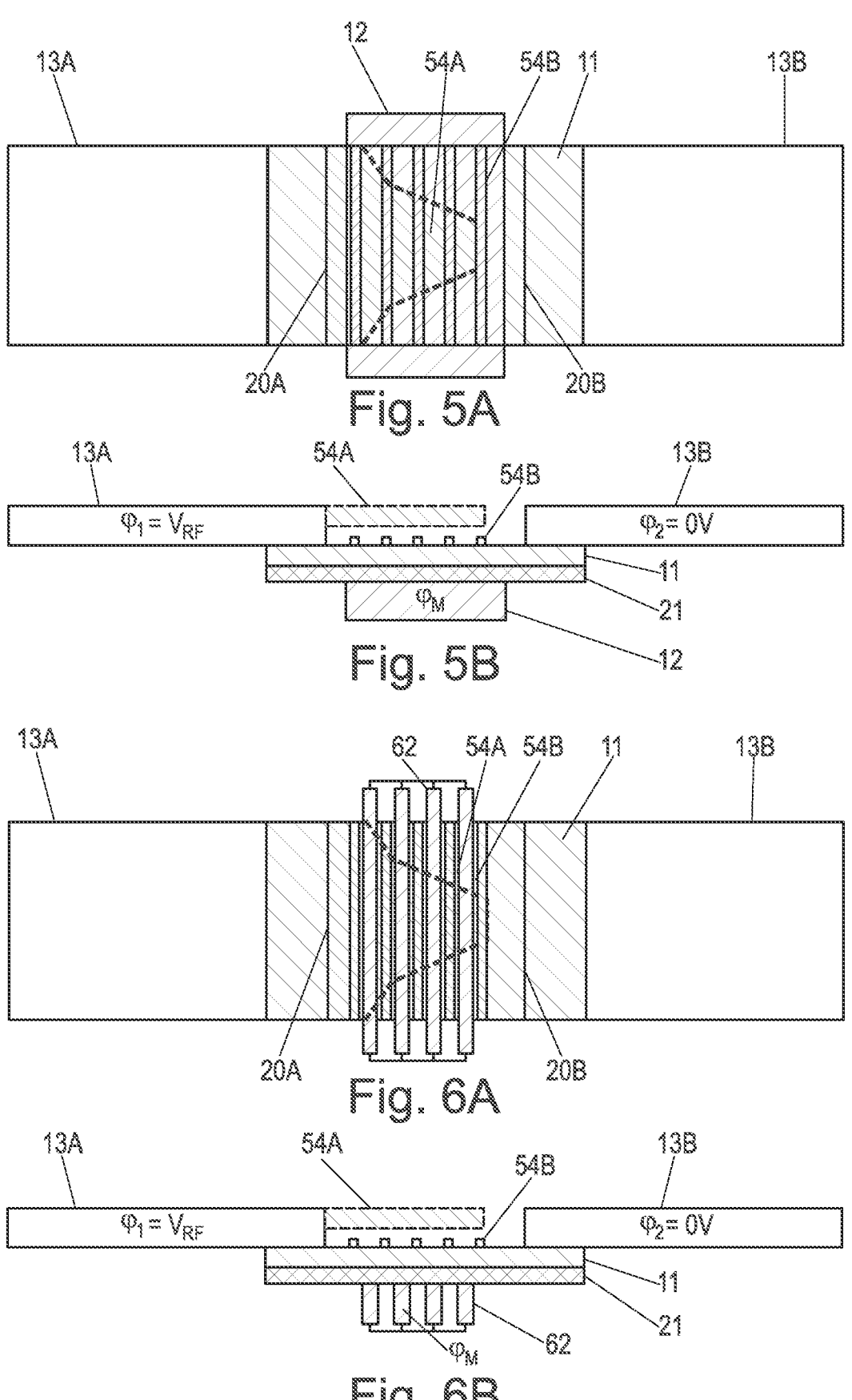
FIGS. 5A and 5B illustrate a modification of the PCM switch device of FIGS. 4A and 4B, FIGS. 6A and 6B illustrate variations of the embodiment of FIGS. 5A and 5B, FIGS. 7A and 7B illustrate a further embodiment.

FIGS. 5A and 5B illustrate a modification of the PCM switch device of FIGS. 4A and 4B. In FIGS. 5A and 5B, the equalization device includes a tapered electrically conducting element 54A similar to tapered electrically conducting element 44 of FIGS. 4A and 4B. In addition, the equalization device in the embodiment of FIGS. 5A and 5B includes a plurality of conducting stripes 54B extending in a direction perpendicular to a direction from electrode 13A to electrode 13B. Electrically conducting stripes 54B may for example be made of metal, of highly doped polysilicon or of other doped semiconductor materials.

The capacitive coupling in FIGS. 5A and 5B, similar to FIGS. 4A and 4B, is determined by the overlap area between electrically conducting element MA and electrically conducting stripes MB. Moreover, electrically conducting stripes MB contribute to making the distribution of the electric field in the direction of the extension of the stripes (up and down direction in FIG. 5A direction perpendicular to the drawing plane in FIG. 5B) more uniform. While five stripes are shown in FIGS. 5A and 5B, the number of stripes and their distance may vary. For example, while in the embodiment of FIGS. 5A and 5B essentially uniform distances are used, in other embodiments non uniform distances may be used.

In the embodiments discussed above, the heater 12 is essentially provided continuously adjacent to the phase change material. In the embodiment of FIGS. 6A and 6B, which is a variations of the embodiment of FIGS. 5A and 5B, as can be seen in the top view of FIG. 6A and the cross-sectional view of FIG. 6B a slotted heater 62 is used. The current through the heater for heating in this case flows from the top of FIG. 6A to the bottom thereof or, in other words, perpendicular to the drawing plane of FIG. 6B, although other arrangements may also be used. In the embodiment of FIGS. 6A and 6B, in the top view the slotted heater portions of heater 62 extend between the conducting stripes 54B, or, in other words, the positions of the slotted heater portions are offset to the conducting stripe. In this case, through the slotted heater, portions of phase change material 11 close to conducting stripes 54B may remain crystalline in the switched off state of the PCM switch device, providing a better ohmic contact between phase change material 11 and electrically conducting stripes 54B.

The tapered electrically conducting element 44 of 54A is only one possibility to provide a varying capacitive coupling. Further possibilities will be discussed next.

In FIGS. 7A and 7B illustrate a further embodiment, where again FIG. 7A illustrates a top view and FIG. 7B illustrates a cross-sectional view. In FIGS. 7A and 7B, for implementation of the equalization device an electrically conducting element 74 is provided. In contrast to the previously discussed embodiments, this electrically conducting element 74 is not tapered and has a width corresponding to the width of phase change material 11, but has circular openings therein, the density of which increases from electrode 13A towards electrode 13B. This also leads to a reduced capacitive coupling from electrode 13A towards electrode 13B. It should be noted that this and other embodiments discussed in the following may be combined with electrically conducting stipes like conducting stripes 54A of FIGS. 5A and 5B and/or with a slotted heater like heater 62 of FIGS. 6A and 6B.

In the embodiments of FIGS. 3-7B, essentially, as shown in FIG. 3, capacitors are provided in parallel between electrode 13A and phase change material 11. In other embodiments capacitances may be provided in series, with nodes between the capacitances being coupled to the phase change material.

FIG. 8 is a cross-sectional view illustrating such an embodiment. Here, an equalization device 84 is provided, with series capacitances electrically coupled to electrode 13A and nodes between the series capacitances and at the end of the series chain coupled to phase change material 11.

As a series connection of capacitances generally leads to a reduced capacitance compared to the individual capacitors, this means that the capacitive coupling strength decreases from electrode 13A towards electrode 13B. By selecting capacitance values accordingly, also an essentially constant electrical field may be achieved.

FIG. 9 illustrates a cross-sectional view of an embodiment showing a possible implementation of such a series chain of capacitors. In the embodiment of FIG. 9, the capacitors are implemented as discrete capacitances 94A. Such discrete capacitances may be implemented on a same chip die as the phase change switch device, or may be implemented separately and connected for example using bond wires. These discrete capacitances are coupled to phase change material 11 via electrically conducting stripes 94B, which may be implemented as explained for conducting stripes 54B of FIGS. 5A and 5B. The connection from capacitances 94A to conducting stripes 94B may be via bond wires. This may again be combined with a slotted heater to improve ohmic contact between conducting stripes 94B and phase change material 11.

Figures 10, 11A, 11B, 12A:
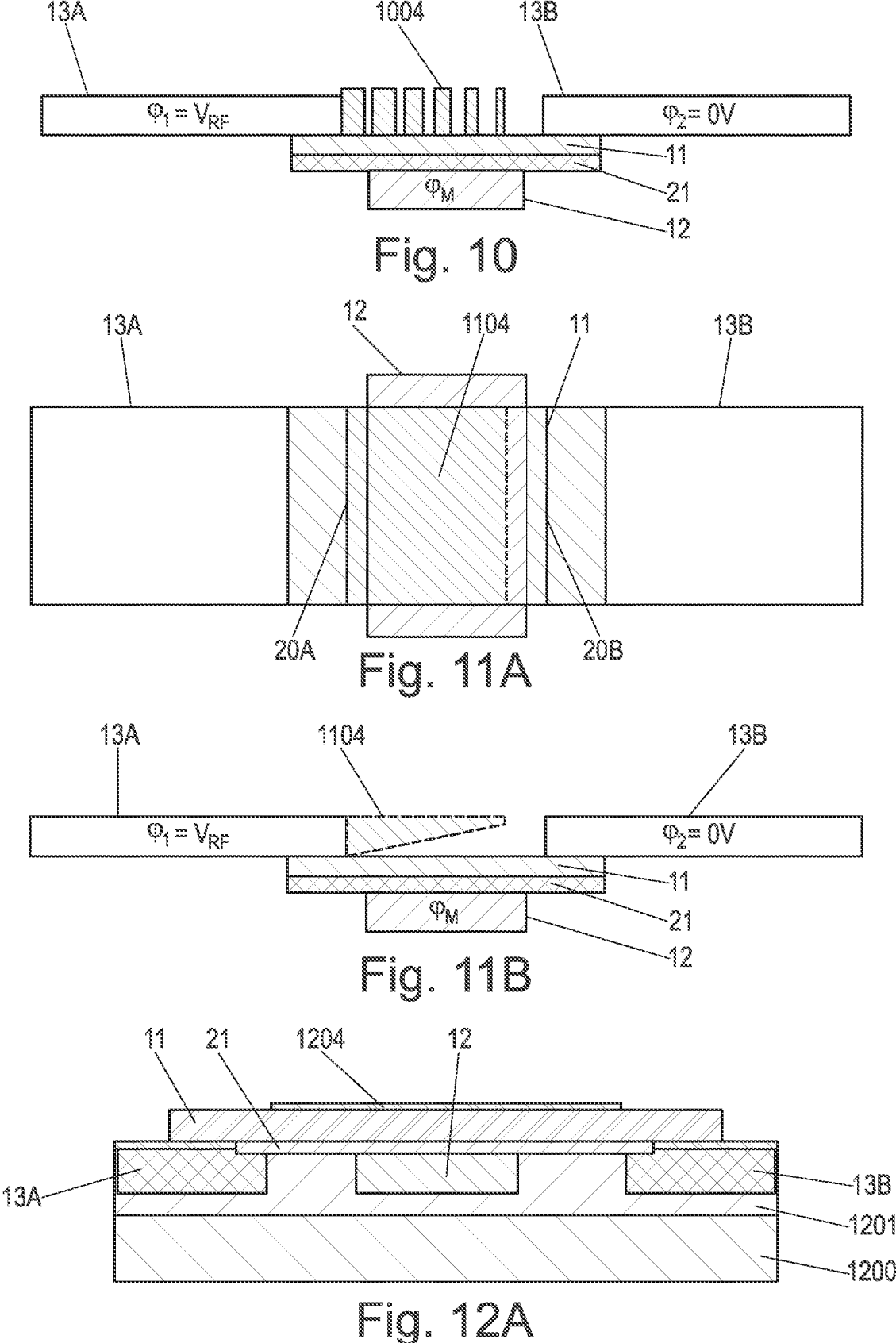

FIG. 10 illustrates another implementation of series capacitors. Here, as equalization device 1004, blocks of electrically conducting material with varying distances are deposited on phase change material. As a greater distance between conducting blocks corresponds to a smaller capacitance, this also leads to a decreasing capacitive coupling from electrode 13A to phase change material 11 in a direction from electrode 13A to 13B. The dimensions of the blocks and their distance may be determined corresponding to the required capacitive coupling.

FIGS. 11A and 11B show a further example for an equalization device using a varying capacitance, where here again parallel capacitances, as in FIG. 3 are used. FIG. 11A shows a top view, while FIG. 11B shows a cross-sectional view. Here, as equalization device an electrically conducting element 1104 is provided, which in the cross section has a wedge shape, such that the distance between electrically conducting element 1104 and phase change material 11 increases from electrode 13A towards electrode 13B, leading to a decreasing capacitance.

Therefore, as can be seen from the various examples given, a plurality of possibilities exist for implementing an equalization device with varying capacitive coupling between electrode 13A and phase change material 11.

Instead of a capacitive coupling, also a resistive coupling may be used. Corresponding embodiments will be described next.

Generally, the electric field in the amorphous zone is given by the current density multiplied with the conductivity. Assuming a constant conductivity in the amorphous zone, a constant current density is needed to achieve a constant electric field. In a typical device the current density decreases towards the center of the amorphous zone or towards the second electrode because current lost via capacitive coupling towards the heater and flows either to the heater terminals or the second electrode (13B in the examples above) circumventing the central region of amorphous zone. Therefore, to keep the electric field constant current needs to be in injected for balancing the losses which is done by the capacitive coupling in the embodiments discussed above with respect to FIGS. 3-11B. By using a resistive coupling, current is instead predominantly injected via a resistive coupling (although as with most real life implementations of such devices, capacitances and inductances may also be present in the following embodiments, e.g. as parasitic capacitances and inductances).

Compared to a capacitive coupling, with a resistive coupling an increase of the product Ron (on resistance)×Coff (off capacitance), i.e. the figure of merit mentioned further above, of the switch may be avoided or reduced. On the other hand, the off resistance may be decreased. In both cases, the maximum voltage that may be handled by these switch in the off-state may be increased.

Figure 12B:
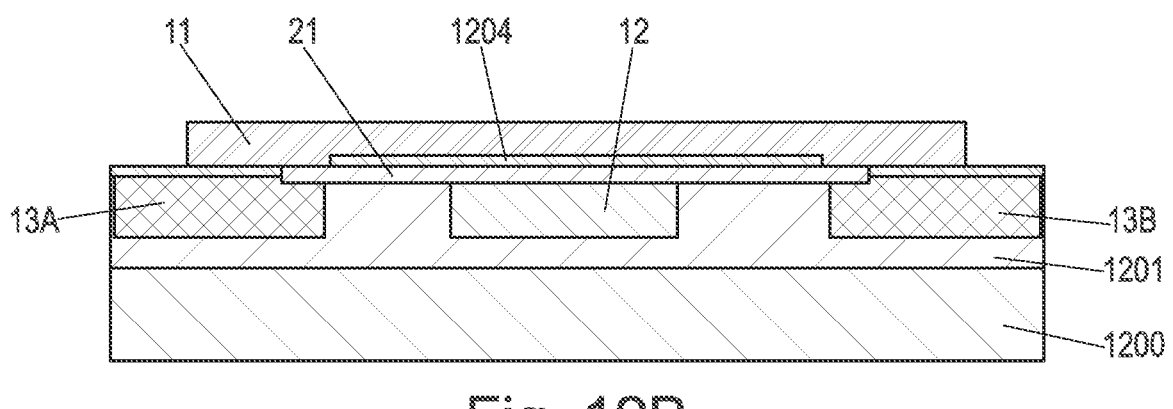
Figure 12C:
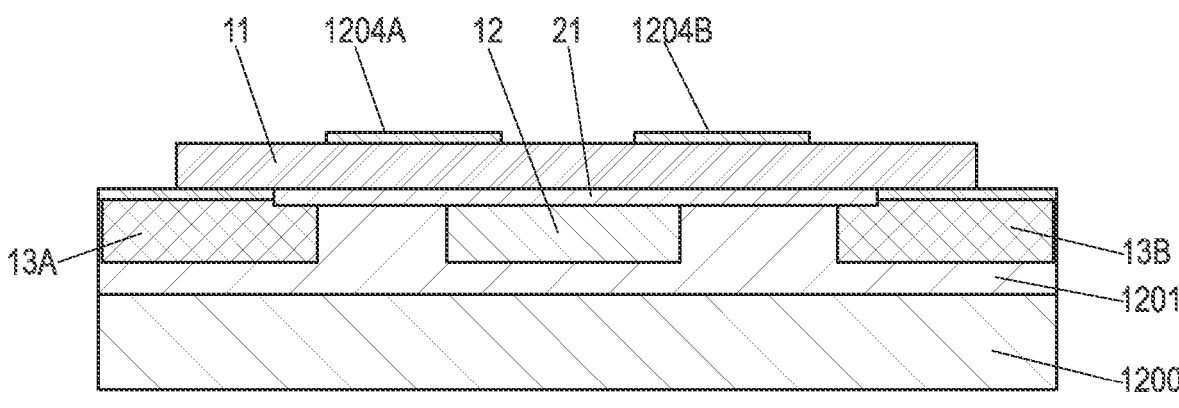

FIG. 12A-12C show various embodiments using such a resistive coupling established by an additional layer having an appropriate ohmic resistance.

FIG. 12A-12C each show cross-sectional views of PCM switch devices according to respective embodiments. The switch devices are provided on a substrate 1200 (for example silicon substrate), and reference numeral 1201 denotes a filler material like a silicon oxide or nitride. Electrodes 13A, 13B, phase change material 11, electrically insulating layer 21 and heater 12 may have the same configuration as discussed previously.

In the embodiment of FIG. 12A, a resistive layer 1204 is deposited on phase change material 11 providing the resistive coupling. In case of FIG. 12B resistive layer 1204 is provided between electrically insulating layer 21 and phase change material 11. In case of FIG. 12C, the resistive layer is patterned leading to a two part layer 1204A, 1204B in FIG. 12C. Other patternings, for example a wedge shaped pattern, tapered pattern, or a pattern with holes are also possible. Moreover, a patterned layer may also be provided between phase change material 11 and electrically insulating layer 21, i.e. resistive layer 1204 of FIG. 12B may also be patterned. It should be noted that resistive layers 1204 are coupled to electrode 13A via phase change material 11, which may remain crystalline near electrode 13A, such that also in this case the equalization device formed by resistive layer 1204 is coupled to electrode 13A.

The resistance, in this case sheet resistance, of resistive layer 1204 (including patterned layer 1204A, 1204B of FIG. 12C) is selected to be comparatively high, to only make the electrical field more uniform without significantly decreasing the off resistance of the PCM switch device by providing an additional conducting path. For example, the sheet-resistance of the resistive layer 1204 may for example be of the order of 10% of the sheet resistance of the phase change material. Suitable materials for the resistive layer 1204 are titanium nitride (TIN), lowly doped silicone (for example to $1 \times 10^{16}/cm^3$), indium tin oxide (ITO), or amorphous carbon. Layer thicknesses of resistive layer 1204 may for example be between 1 nm and 20 nm, depending on the resistivity of the material you used, to obtain a desired sheet resistance. Generally as mentioned above, the resistivity of resistive layer 1204 is selected as a compromise between the off resistance of the PCM switch device and the maximum voltage it can handle in an off state.

Also, for example the size of the gap between layer portions 1204A, 1204B may be tailored accordingly.

Besides providing a dedicated resistive layer, a resistive coupling may also be obtained by the phase change material itself. Corresponding embodiments will now be discussed referring to FIGS. 13 and 14.

Figure 13:
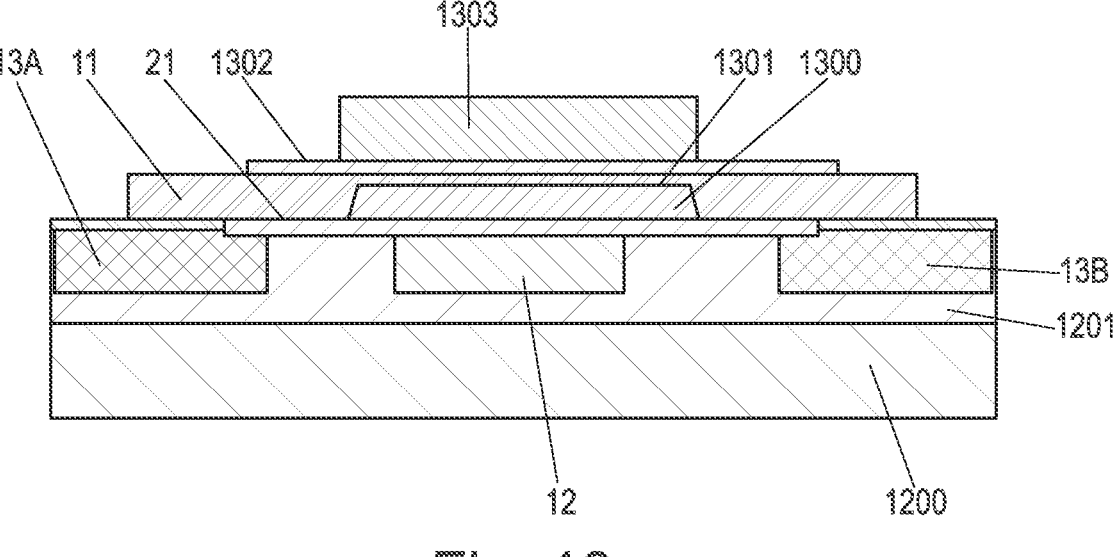

FIG. 13 illustrates a cross-sectional view of a PCM switch device according to a further embodiment. In contrast to the embodiments of FIG. 12A to 12C, the embodiment of FIG. 13 does not include the resistive layer 1204. Instead, a heat sink 1303 is provided above phase change material 11 and separated from phase change material 11 via a further electrically insulating, but thermally conducting layer 1302. Heat sink 1303 may for example implemented as a metal block or any other thermally conducting material serving to transport heat away from the phase change layer 11.

When the switch device of FIG. 13 is switched off, by heating phase change material 11 using heater 12 and region 1300 of phase change material 11 turns amorphous. However, due to the presence of heat sink 1303, heat is conducted away from the top of phase change material, causing a thin portion 1301 of phase change material 11 to remain crystalline or at least partially crystalline. In this way, region 1301 constitutes a resistive layer with the same function as resistive layer 1204 of FIGS. 12A to 12C. It should be noted that the thicknesses of portions 1300, 1301 are not necessarily drawn to scale, and heat sink 1303 is designed such that portion 1301 is thin enough to have only a low electrical conductivity, similar to what was explained for resistive layer 1204 above.

FIG. 14 illustrates a modification to the embodiment of FIG. 13. Here, the chemical composition of phase change material is modified, for example by doping for example during deposition, with ion implantation or with diffusion or otherwise varying the chemical composition such that the amorphous resistivity or amorphization process in a portion 1402 is modified. Due to this modification, in the switched off state a portion 1410 is changed to the amorphous, high resistivity state normally and portion 1402 exhibits a lower resistance, thus forming again a resistive layer having the same function as explained for resistive layer 1204 of FIGS. 12A-12C.

As mentioned above, providing a resistive layer reduces the off resistance of the switch, which may increase the power dissipation in the off state (the dissipated power $P_{max}$ is equal to $Vrfmax^2/(2Roff)$, the maximum voltage Vrfmax applied squared, divided by 2 times the off resistance Roff. The shown switch devices are designed such that the power dissipation does not lead to a crystallization by heating. In embodiments, this may be achieved by ensuring that $P_{max}$ is smaller than 20% of the power applied via the heater when switching from the on-state to the off-state. Moreover, the materials used are selected to withstand the temperatures as at switching.

In the embodiments above, single switch devices with a continuous phase change material are discussed. Techniques discussed above for equalization to ensure a uniform electrical field may, in a similar manner, also be applied to a series connection of a plurality of switches, to ensure a constant electric power field in all these switches. Corresponding embodiments will be discussed next.

First, with respect to FIGS. 15A and 15B, a representation for such switch devices will be discussed, before specific embodiments will be discussed referring to FIGS. 16 to 18.

FIG. 15A illustrates what is referred to as a phase change switch cell, PCS cell, 1500 herein. Such a PCS cell is essentially a phase change switch as discussed above, with first and second electrodes 13A, 13B, a heater and a phase change material. PCS cell 1500 is shown with electrical connections or terminals coupled to or consisting of electrodes 13A, 13B, and at least one terminal 1501 for supplying electrical power to a respective heater (another terminal of the heater may be coupled to ground, for example).

FIG. 15B shows a switch device where a plurality of PCS cells 1500 are coupled in series. This essentially may be seen as a single phase change switch, where the phase change material is in interrupted by electrically conducting portions (the electrodes 13A, 13B of adjacent PCS cells 1500 coupled with each other or being formed as a single electrode), and the heater being subdivided too, somewhat similar to the slotted heater of FIGS. 6A and 6B. Also in this case, an uneven distribution of the electric field may occur.

To mitigate an uneven distribution of the electrical field, equalization devices may be used. A corresponding embodiment is illustrated in FIG. 16. A first equalization device 1600 is provided which couples a terminal 1602 of the leftmost PCS cell 1500 shown (corresponding to electrode 13A in the embodiments of FIGS. 1-14) with nodes between the individual PCS cells 1500. A second equalization device 1602 couples electrode 1602 to the heaters of PCS cells 1500. In other embodiments, only one of equalization devices 1600, 1601 may be employed.

Equalization devices 1600, 1601 may be capacitive equalization devices, resistive equalization devices or a combination thereof. FIGS. 17 and 18 show example for capacitive equalization devices which may be used as equalization devices 1600 and 1601 of FIG. 16.

FIG. 17 illustrates an equalization device 1704 as a network of parallel capacitors 1700, similar to equalization device 34 of FIG. 3.

FIG. 18 illustrates an equalization device 1804 with a plurality of series capacitors 1800, similar to equalization device 84 of FIG. 8. The individual capacitors 1700, 1800 may be dimensioned as explained above with respect to FIGS. 3 and 8, for example based on simulations or calibration measurements. By providing second equalization network 1601, heater voltage bootstrapping may be provided. The bootstrapping equalizes the RF voltage distribution along the heater network (each heater corresponding to the respective PCS cell), thus maximizing the voltage handling capability of the switch. It should be noted that an equalization device for a heater may for example also be applied to a slotted heater like heater 62 of FIGS. 6A and 6B.

Figure 19:
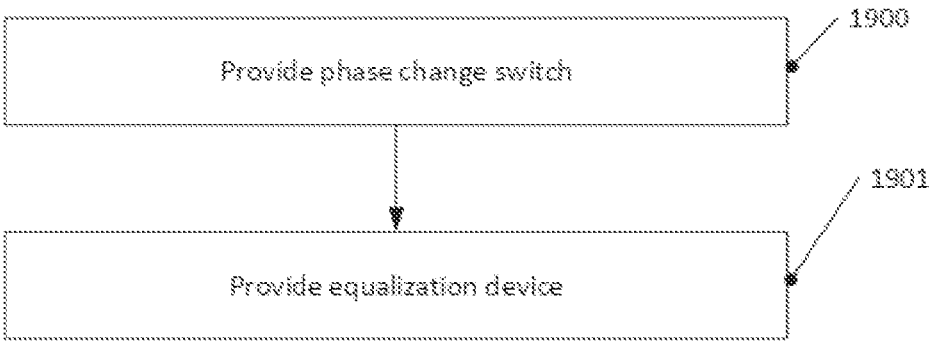
FIG. 19 is a flowchart illustrating a manufacturing method according to some embodiments.

FIG. 19 illustrates a method for manufacturing a phase change switch device according to some embodiments. The method of FIG. 19 may be used to manufacture any of the PCM switch devices described above, and will be explained referring to these PCM switch devices discussed above in order to avoid repetitions.

At 1900, the method of FIG. 19 comprises providing a phase change switch, including a heater and a phase change material, for example by layer deposition on a substrate. At 1901, the method includes providing an equalization device for the phase change material and/or for heaters, for example by depositing a resistive layer, depositing capacitors, coupling discrete capacitors or the like, as explained above.

Figure 20:
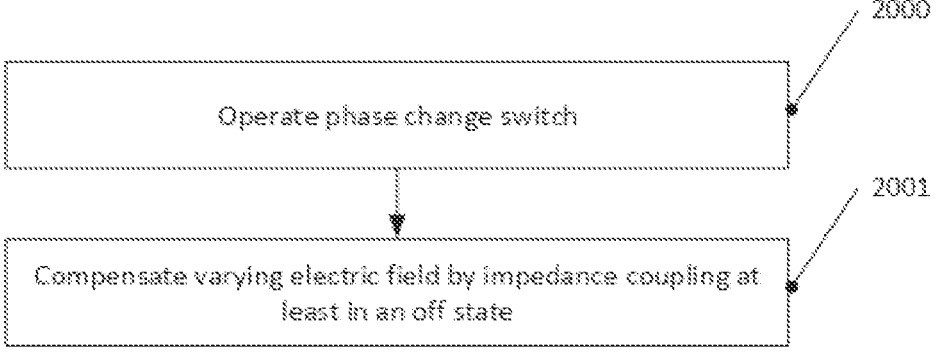
FIG. 20 is a flowchart illustrating an operation method according to some embodiments.

FIG. 20 illustrates a method for operating a phase change switch device. The method of FIG. 20 may be used to operate any of the phase change switch devices mentioned above. At 2000, the method comprises operating a phase change switch device, i.e. switching the phase change switch device on and/or off as required by a specific application. At 2001, the method comprises compensating a varying electric field at a phase change material of the phase change switch by impedance coupling, for example capacitive coupling or resistive coupling, as discussed above. Alternatively or additionally, the method may comprise mitigating heater bootstrapping by impedance coupling to a heater, in case a slotted heater or a plurality of heaters are provided.

It should be noted that in the embodiments of FIGS. 19 and 20, the phase change switch device may have a continuous phase change material, as shown in FIGS. 1-14, or may consist of a plurality of PCS cells corresponding to an interrupted or discontinuous phase change material, as explained with reference to FIGS. 15-18.

Some embodiments are defined by the following examples:

Example 1. A phase change material switch device, comprising: a phase change material, a first electrode electrically coupled to the phase change material, at least one heater thermally coupled to the phase change material, and an equalization device configured to provide an impedance coupling between the first electrode and the phase change material that varies over the phase change material.

Example 2. The phase change material switch device of example 1, wherein the equalization device is configured such that the varying impedance coupling at least partially compensates a varying electrical field over a length of the phase change material when the device is in a switched off state and a voltage is applied to the first electrode.

Example 3. The phase change material switch device of example 1 or 2, wherein the equalization device comprises a plurality of discrete capacitors.

Example 4. The phase change material switch device of any one of examples 1 to 3, wherein the equalization device comprises a plurality of discrete resistors.

Example 5. The phase change material switch device of any one of examples 1 to 4, wherein the equalization device is coupled to the first electrode via a part of the phase change material configured to remain electrically conducting when the phase change material switch device is in a switched off state.

Example 6. The phase change material switch device of any one of examples 1 to 5, wherein the phase change material comprises a continuous phase change material electrically coupled between the first electrode and a second electrode, wherein the equalization device is configured to provide the varying impedance coupling between the continuous phase change material and the first electrode.

Example 7. The phase change material switch device of example 6, wherein the impedance coupling comprises a capacitive coupling.

Example 8. The phase change material switch device of example 7, wherein the capacitive coupling decreases from the first electrode towards the second electrode.

Example 9. The phase change material switch device of example 7 or 8, wherein the equalization device comprises an electrically conducting material electrically coupled to the first electrode and arranged above a surface and distanced to the surface of the phase change material.

Example 10. The phase change material switch device of example 9, wherein the electrically conducting material has a tapered shape to provide the varying capacitance.

Example 11. The phase change material switch device of example 9 or 10, wherein the electrically conducting material has gaps to provide the varying capacitance.

Example 12. The phase change material switch device of any one of examples 9 to 11, wherein the distance of the electrically conducting material to the surface of the phase change material varies to provide the varying capacitance.

Example 13. The phase change material switch device of any one of examples 6 to 12, wherein the impedance coupling comprises a resistive coupling.

Example 14. The phase change material switch device of example 13, wherein the equalization device comprises an electrically conducting layer provided adjacent to the phase change material.

Example 15. The phase change material switch device of example 14, wherein the electrically conducting layer is in contact with the phase change material.

Example 16. The phase change material switch device of example 14 or 15, wherein the electrically conducting layer has sheet resistance at least 10 times smaller than an amorphous portion of the phase change material when the phase change material switch device is in an off state.

Example 17. The phase change material switch device of any one of examples 14 to 16, wherein the electrically conducting layer is a patterned layer.

Example 18. The phase change material switch device of any one of examples 13 to 17, wherein the equalization device comprises a part of the phase change material.

Example 19. The phase change material switch device of any one of examples 1 to 18, wherein the phase change material comprises a plurality of discontinuous portions electrically coupled in series between the first electrode and a further electrode.

Example 20. The phase change material switch device of example 19, wherein the equalization device provides a varying impedance coupling to electrical connections between adjacent discontinuous portions of the series connection.

Example 21. The phase change material switch device of any one of examples 1 to 20, wherein the at least one heater comprises a plurality of spaced apart heaters.

Example 22. The phase change material switch device of example 21 and any one of examples 9 to 12, wherein a plurality of conductive stripes are provided on the surface of the phase change material to form capacitors with the electrically conducting material.

Example 23. The phase change material switch device of example 22, wherein the spaced apart heaters are arranged on a side of a further surface of the phase change material opposite the surface and between the conductive stripes in a top view on the surface.

Example 24. The phase change material switch device of example 21 and one of examples 19 or 20, wherein each of the plurality of spaced apart heaters is coupled to a respective discontinuous portion.

Example 25. The phase change material switch device of any one of examples 21 to 24, wherein the device comprises a further equalization device configured to provide varying capacitive coupling between the first electrode and the plurality of spaced apart heaters.

Example 26. A phase change material switch device, comprising: a phase change material, a first electrode electrically coupled to the phase change material, a plurality of spaced apart heaters thermally coupled to the phase change material, and an equalization device configured to provide varying impedance coupling between the first electrode and the plurality of spaced apart heaters.

Example 27. A method for manufacturing a phase change material switch device, comprising: providing a phase change switch including a phase change material, a first electrode electrically coupled to the phase change material, and at least one heater thermally coupled to the phase change material, and providing an equalization device configured to provide an impedance coupling between the first electrode and at least one of the phase change material that varies over the phase change material or between the first electrode and the at least one heater varying over the at least one heater.

Example 28. The method of example 27, configured to manufacture the phase change material switch device of any one of examples 1 to 26.

Example 29. A method for a phase change switch device, comprising: operating the phase-change switch device, and compensating a varying electric field in an off-state of the phase-change switch device by a varying impedance coupling.

Example 30. The method of example 29, wherein the phase change switch device is the phase change switch device of any one of examples 1 to 26.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase change material switch device, comprising:

a phase change material;

a first electrode electrically coupled to the phase change material;

at least one heater thermally coupled to the phase change material; and an equalization device providing an impedance coupling between the first electrode and the phase change material, wherein the impedance coupling varies over the phase change material, wherein the varying impedance coupling provided by the equalization device at least partially compensates a varying electrical field over a length of the phase change material when the phase change material switch device is in a switched off state and a voltage is applied to the first electrode.

2. The phase change material switch device of claim 1, wherein the equalization device comprises a plurality of discrete capacitors coupled between the first electrode and the phase change material.

3. The phase change material switch device of claim 1, wherein the phase change material comprises a continuous phase change material electrically coupled between the first electrode and a second electrode, wherein the equalization device is configured to provide the varying impedance coupling between the continuous phase change material and the first electrode.

4. The phase change material switch device of claim 3, wherein the impedance coupling comprises a capacitive coupling.

5. The phase change material switch device of claim 4, wherein the capacitive coupling decreases from the first electrode towards the second electrode.

6. The phase change material switch device of claim 4, wherein the equalization device comprises an electrically conducting material electrically coupled to the first electrode and arranged above a surface and distanced to the surface of the phase change material.

7. The phase change material switch device of claim 6, wherein the electrically conducting material has a tapered shape to provide the varying capacitance.

8. The phase change material switch device of claim 3, wherein the impedance coupling comprises a resistive coupling.

9. The phase change material switch device of claim 8, wherein the equalization device comprises an electrically conducting layer provided adjacent to the phase change material.

10. The phase change material switch device of claim 1, wherein the phase change material comprises a plurality of discontinuous portions electrically coupled in series between the first electrode and a further electrode.

11. The phase change material switch device of claim 10, wherein the equalization device is configured to provide a varying impedance coupling to electrical connections between adjacent discontinuous portions of the series connection.

12. The phase change material switch device of claim 1, wherein the at least one heater comprises a plurality of spaced apart heaters.

13. The phase change material switch device of claim 12, further comprising a further equalization device configured to provide varying capacitive coupling between the first electrode and the plurality of spaced apart heaters.

\* \* \* \* \*